United States Patent
Baker, Jr. et al.

(10) Patent No.: US 7,269,090 B2
(45) Date of Patent: Sep. 11, 2007

(54) MEMORY ACCESS WITH CONSECUTIVE ADDRESSES CORRESPONDING TO DIFFERENT ROWS

(75) Inventors: Frank K. Baker, Jr., Austin, TX (US); James D. Burnett, Austin, TX (US); Thomas Jew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1145 days.

(21) Appl. No.: 09/772,830

(22) Filed: Jan. 30, 2001

(65) Prior Publication Data

US 2002/0103959 A1    Aug. 1, 2002

(51) Int. Cl.
G06F 7/00    (2006.01)
G06F 8/00    (2006.01)

(52) U.S. Cl. .......................... 365/230.06; 365/189.01; 711/1

(58) Field of Classification Search ........ 711/103–105, 711/201, 170; 365/185.01, 230.03, 235, 365/233.5

See application file for complete search history.

(56) References Cited

U.S. PATENT DOCUMENTS

| | | | |
|---|---|---|---|
| 4,316,264 A | 2/1982 | Harari | 365/190 |
| 4,683,554 A | 7/1987 | Lockwood et al. | 365/185 |
| 4,943,944 A * | 7/1990 | Sakui et al. | 365/189.05 |
| 5,285,421 A * | 2/1994 | Young et al. | 365/230.04 |
| 5,325,335 A | 6/1994 | Ang et al. | 365/205 |
| 5,336,937 A * | 8/1994 | Sridhar et al. | 706/33 |
| 5,498,559 A | 3/1996 | Chang | 437/43 |
| 5,502,678 A | 3/1996 | McClure | 365/201 |
| 5,715,421 A * | 2/1998 | Akiyama et al. | 711/213 |
| 5,754,817 A | 5/1998 | Wells et al. | 395/413 |
| 5,828,603 A | 10/1998 | Pathak | 365/185.21 |
| 5,920,504 A * | 7/1999 | Lee et al. | 365/185.11 |
| 5,933,368 A * | 8/1999 | Ma et al. | 365/185.33 |
| 6,083,271 A * | 7/2000 | Morgan | 716/1 |
| 6,105,114 A * | 8/2000 | Okuno | 711/155 |
| 6,392,438 B1 * | 5/2002 | Cliff et al. | 326/41 |

OTHER PUBLICATIONS

Machine Translation of JP 2002-118851, Detailed Description, JPO, 2002.*
Microsoft Press Computer Dictionary, 3rd Ed., 1997, pp. 67, 349, 510.*
Abstract, S.H. Wood et al., "Read disturb errors in a CMOS static RAM chip", 1989 IEEE Aerospace Applications Conference Digest (Cat. No. 89TH0233-7), p. 13; 1989.
Abstract, T. Endoh et al., "New write/erase operation technology for flash EEPROM cells to improve the read disturb characteristics", IEICE Transactions of Electronics, vol. E80-C, No. 10, pp. 1317-1323; Oct. 1997.

* cited by examiner

Primary Examiner—B. James Peikari

(57) ABSTRACT

A memory system (200) has an array of addressable storage elements (210) arranged in a plurality of rows and a plurality of columns, and decoding circuitry (220, 230) coupled to the array of addressable storage elements (210). The decoding circuitry (220, 230), in response to decoding a first address, accesses a first storage element of a first row of the plurality of rows, and, in response to decoding a second address consecutive to the first address, accesses a second storage element of a second row of the plurality of rows. The second row of the plurality of rows is different from the first row of the plurality of rows. By implementing a memory system wherein consecutive addresses correspond to storage elements of different rows, read disturb stresses along a single row can be minimized.

35 Claims, 5 Drawing Sheets

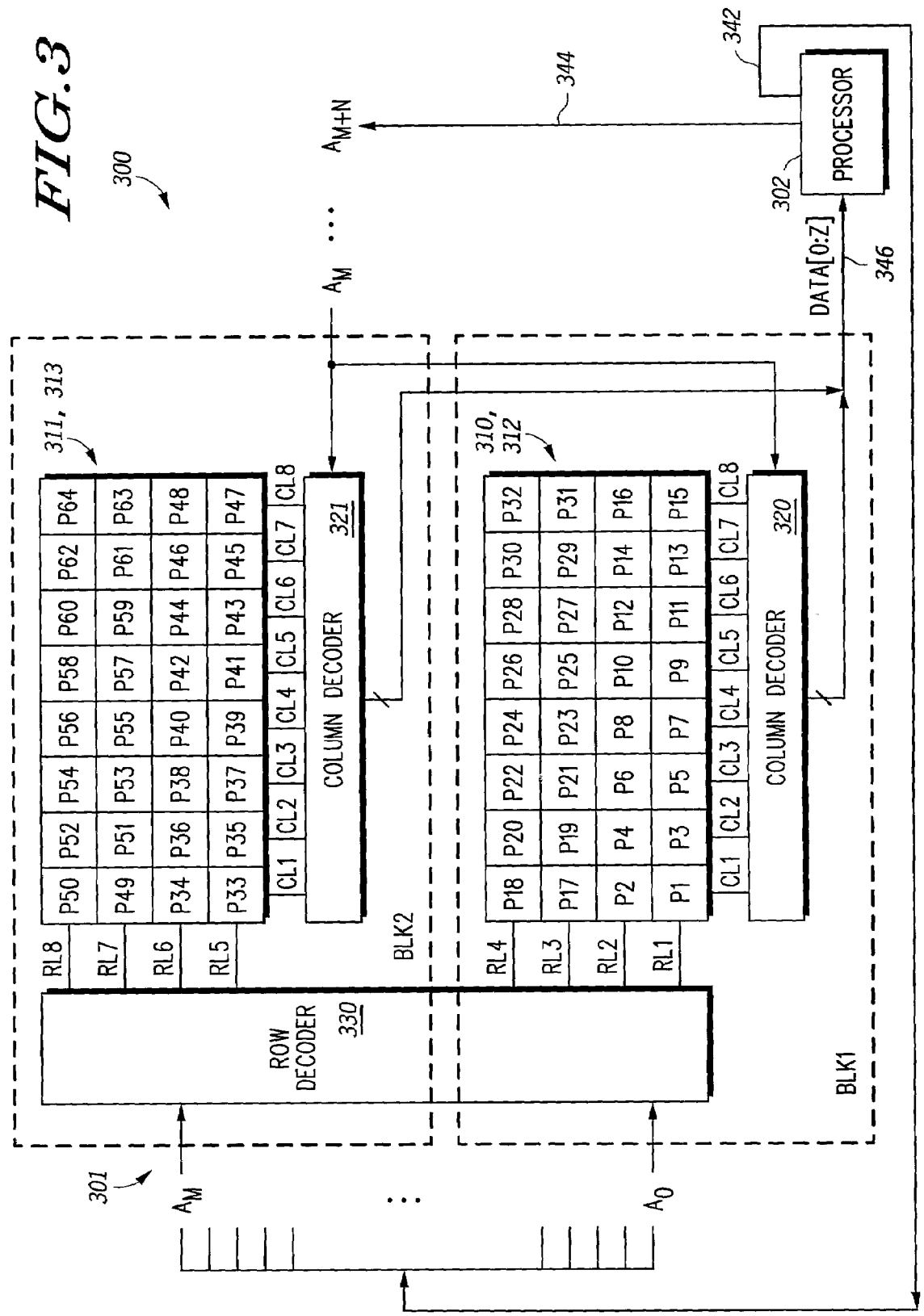

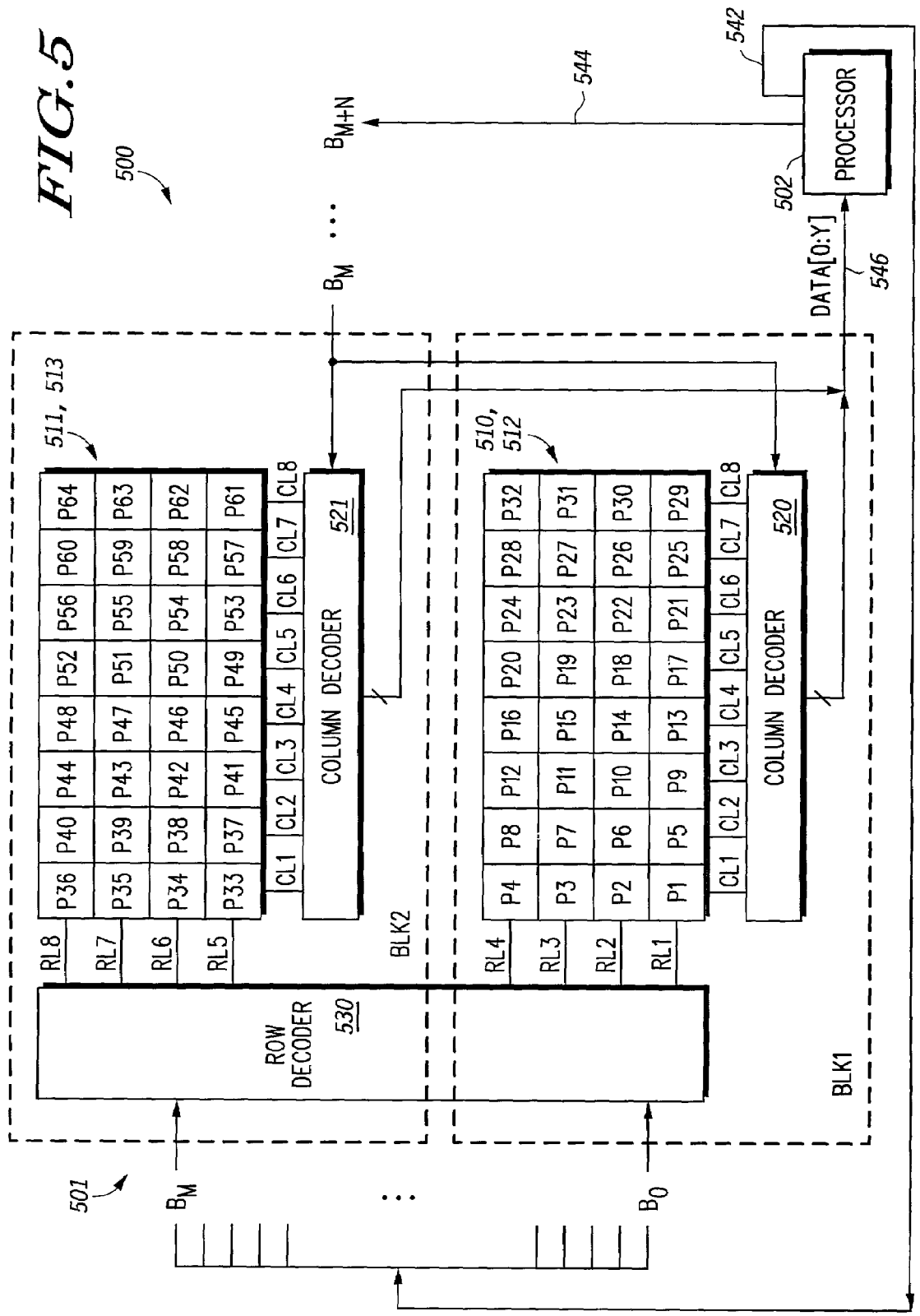

MEMORY ACCESS WITH CONSECUTIVE ADDRESSES CORRESPONDING TO DIFFERENT ROWS

FIELD OF THE INVENTION

The present invention relates generally to memory systems and systems utilizing memory systems, and more particularly to systems and methods for accessing information stored in memory systems.

RELATED ART

Data is stored in a nonvolatile memory as charge on floating gate electrodes of field-effect transistors (FETs), which in turn make up the memory cells of the nonvolatile memory. When measuring charge on the floating gate electrode (i.e., reading data from the memory cell), an electric field appears across the tunnel oxide located between the floating gate electrode and the channel region of the FET of the memory cell. This electric field can cause charge stored on the floating gate electrode to leak off. The electric field seen by the floating gate electrode is smaller during read operations than during write operations, but a nonvolatile memory may be read continuously for a large part of its life. After such prolonged periods of exposure to an electric field, the charge stored on the floating gate electrode can change, and cause a low threshold state to be indistinguishable from a high threshold state during a read operation. This results in a "read disturb" of the memory cell.

FIG. 1 illustrates a conventional memory system 100. The memory system 100 has a nonvolatile memory array 110; a column decoder 120 coupled to the memory array 110 via column lines CL1, CL2, CL3 and CL4; and a row decoder 130 coupled to the memory array 110 via row lines RL1, RL2, RL3 and RL4. The memory array 110 is made up of sixteen memory cells 112 arranged in rows and columns, and numerically designated "1" to "16." Each of the memory cells 112 has an associated address. Address signals A0, A1, A2 and A3 drive the column and row decoders 120 and 130 to access the memory cells 112 by their associated addresses.

To conserve power and reduce access time, the memory system 100 is designed to access memory cells 112 during read operations along rows in the direction of arrow 140, as illustrated in FIG. 1 with respect to the row associated with row line RL1, and in the order of the numerical designations "1" to "16." The address signals A0, A1, A2 and A3 are formatted such that consecutive memory cell addresses are associated with memory cells arranged along the same row of the memory array 110. Unfortunately, such accessing subjects the memory system 100 to read disturb. Read disturb, as mentioned earlier, occurs when the net charge on a memory cell's floating gate changes over time due to the bias voltage which is applied during read operations. If the memory system 100 is accessed to continuously cycle among only some of the memory cells, for example those memory cells 112 designated "1," "2" and "3," then read disturb stress will be focused along the row associated with row line RL1 of the memory array 110.

What is needed is a memory system and a method of accessing a memory system that minimizes read disturb.

BRIEF DESCRIPTION OF THE DRAWINGS

The present invention is illustrated by way of example and not limitation in the accompanying figures, in which:

FIG. 3 is a block diagram illustrating an embedded control system having a memory system according to another embodiment of the present invention;

FIG. 5 is a block diagram of an embedded control system having a memory system according to yet another embodiment of the present invention;

DETAILED DESCRIPTION

A memory system has an array of addressable storage elements arranged in a plurality of rows and a plurality of columns, and decoding circuitry coupled to the array of addressable storage elements. The decoding circuitry, in response to decoding a first address, accesses a first storage element of a first row of the plurality of rows, and, in response to decoding a second address consecutive to the first address, accesses a second storage element of a second row of the plurality of rows. The second row of the plurality of rows is different from the first row of the plurality of rows. By implementing a memory system wherein consecutive addresses correspond to storage elements of different rows, read disturb stresses along a single row can be minimized.

Figure 2:
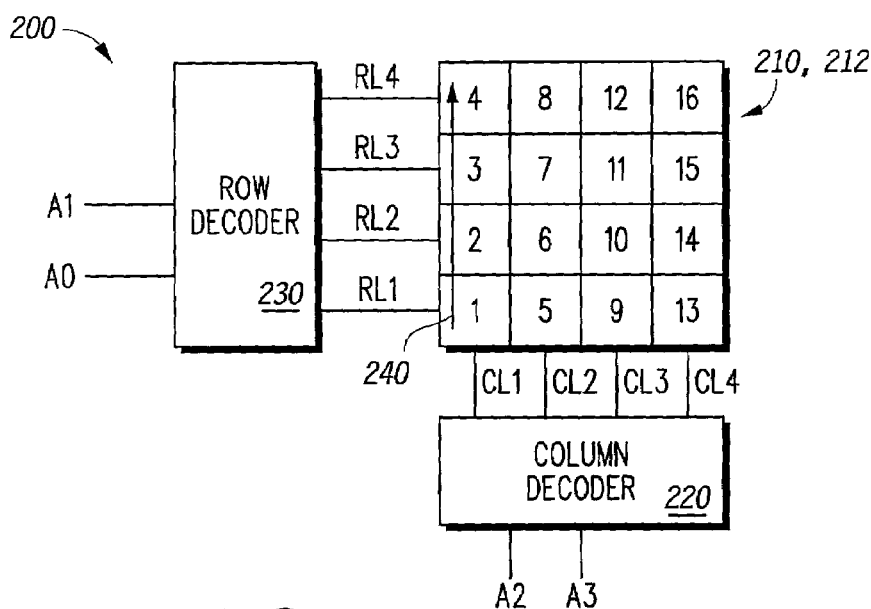
FIG. 2 is a block diagram illustrating a memory system according to an embodiment of the present invention.

FIG. 2 illustrates a memory system 200. The memory system 200 has a memory array 210, and decoding circuitry 220 and 230 coupled to the memory array 210. The memory array 210 is an array of addressable storage elements 212 arranged in a plurality of rows and a plurality of columns. The storage elements 212 may be any suitable memory including but not limited to RAM (random access memory), ROM (read-only memory), EEPROM (electrically erasable programmable read-only memory), and the like. In the embodiment illustrated in FIG. 2, the memory array 210 has sixteen addressable storage elements numerically designated "1" to "16." The addressable storage elements 212 are operable to store data such as an individual bit of digital information; a plurality of bits arranged as a byte, a word or a page; or any other convenient unit of information storage. The decoding circuitry 220 and 230 is made up of a column decoder 220 coupled to the memory array 210 via column lines CL1, CL2, CL3 and CL4 and a row decoder 230 coupled to the memory array 210 via row lines RL1, RL2, RL3 and RL4. The column and row decoders 220 and 230 operate responsive to address signals A0, A1, A2 and A3 to access the addressable storage elements 212 during read operations.

Figure 1:
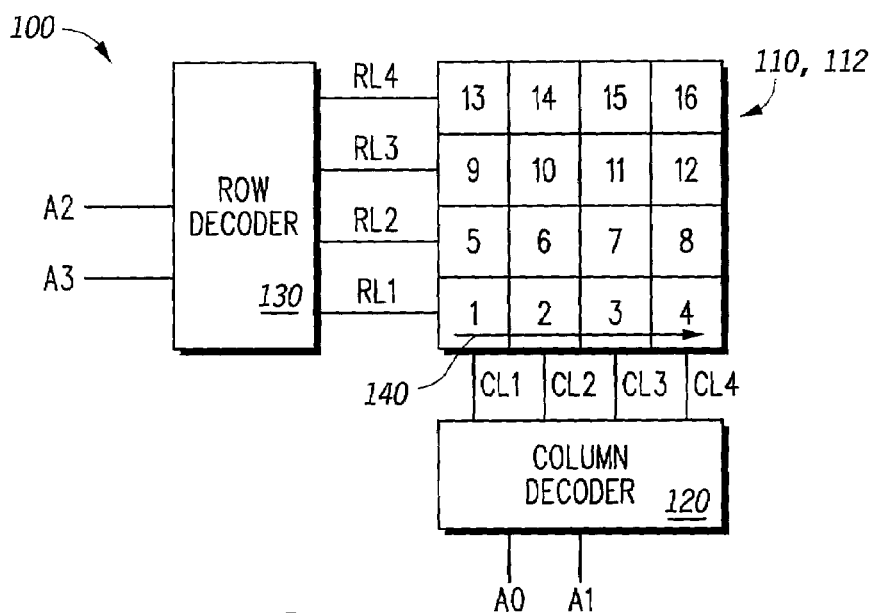
FIG. 1 is a block diagram illustrating a prior art memory system.
Figure 6:
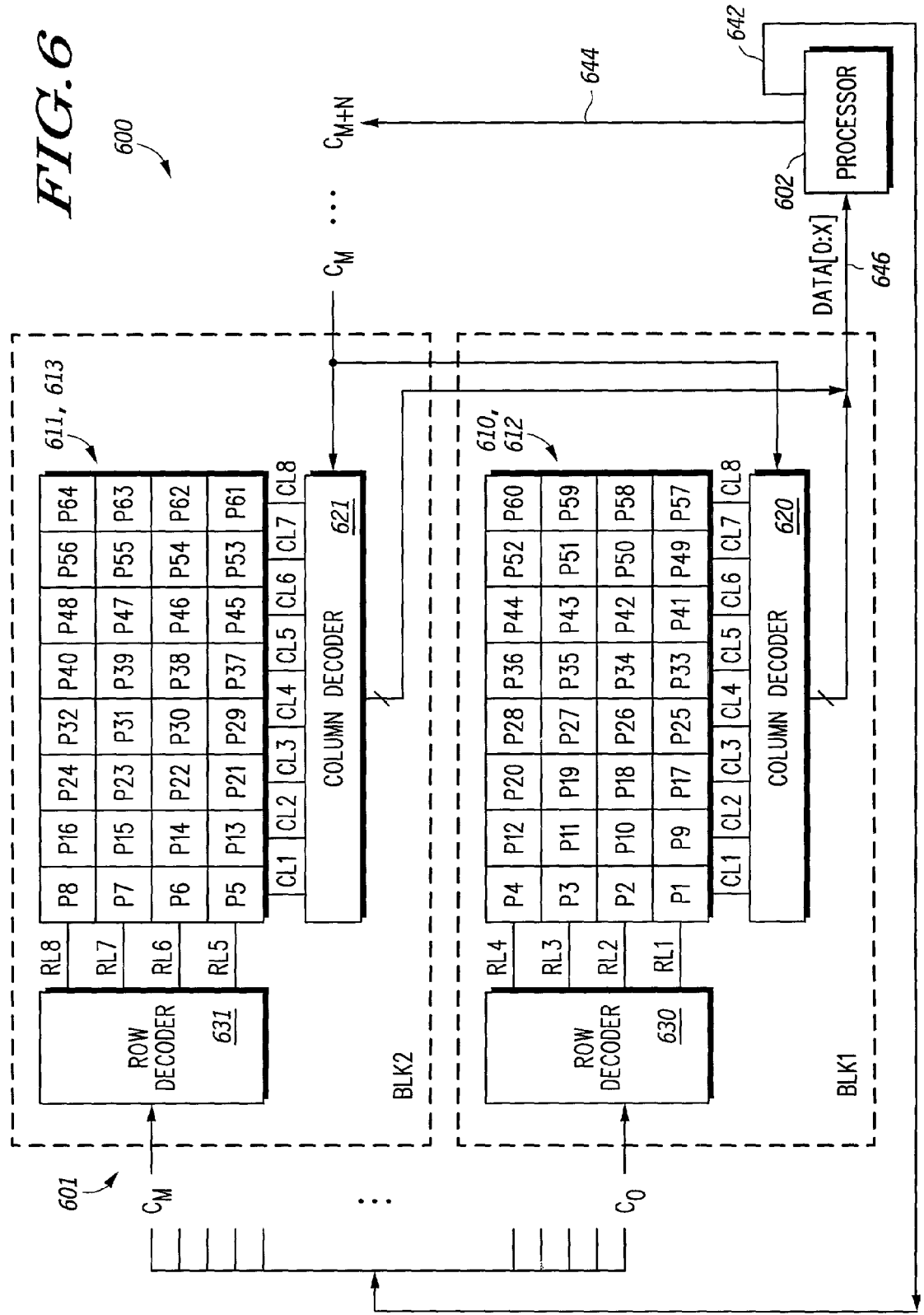
FIG. 6 is a block diagram of an embedded control system having a memory system according to yet another embodiment of the present invention.

Unlike the conventional memory system 100 of FIG. 1, the memory system 200 of FIG. 2 accesses memory cells 212 along columns in the direction of arrow 240, as illustrated in FIG. 2 with respect to the column associated with column line CL1, and in the order of the memory cells' 212 numerical designations 1 to 16. The address signals A0, A1, A2 and A3 are formatted such that consecutive memory cell addresses are associated with memory cells arranged along different rows of the memory array 210. This accessing of the memory array 210 reduces the probability that a single row line will be continuously activated during a read operation and, thereby, reduces read disturb. For example, when accessing memory cells 212 designated 1 to 4, row lines RL1 to RL4 are used, thereby distributing read disturb stress across the entire memory array 210 rather than focusing read disturb stress along a single row of the memory array 210. Other arrangements that spread read disturb stress across multiple rows are shown in FIGS. 3, 5 and 6.

FIG. 3 illustrates an embedded control system 300 having a processor 302 and a memory system 301 coupled to the processor 302. The memory system 301 has an input to receive an address signal, shown as row and column address signals $A_0 \ldots A_M$ and $A_M \ldots (A_{M+N})$, from the processor 302, and an output to send addressed information in the form of a data signal DATA [0:Z] to the processor 302. The memory system 301 includes decoding circuitry, shown as column decoders 320 and 321 and row decoder 330, and memory arrays 310 and 311. The row decoder 330 is coupled to the memory array 310 via row lines R1, R2, R3 and R4 and to the memory array 311 via row lines R5, R6, R7 and R8. The column decoder 320 is coupled to the memory array 310 via column lines CL1, CL2, CL3, CL4, CL5, CL6, CL7 and CL8. The column decoder 321 is coupled to the memory array 311 via column lines CL1, CL2, CL3, CL4, CL5, CL6, CL7 and CL8. The memory array 310 has memory cells 312 arranged in a plurality of rows and a plurality of columns. The memory array 311 has memory cells 313 arranged in a plurality of rows and a plurality of columns. The memory cells 312 and 313 may be any suitable memory including but not limited to RAM (random access memory), ROM (read-only memory), EEPROM (electrically erasable programmable read-only memory), and the like. The portion of the row decoder 330 driving the memory array 310, the column decoder 320 and the memory array 310 may be collectively referred to as a first memory block BLK1. The portion of the row decoder 330 driving the memory array 311, the column decoder 321 and the memory array 311 may be collectively referred to as a second memory block BLK2. The processor 302 is coupled to the input and output of the memory system 301 via connections 342, 344 and 346. The processor 302 sends the row address signal $A_0 \ldots A_M$ to the row decoder 330 via the connection 342; sends the column address signal $A_M \ldots (A_{M+N})$ to the column decoders 320 and 321 via connection 344; and receives addressed information as the data signal DATA [0:Z] from the column decoders 320 and 321 via connection 346.

Figure 4:
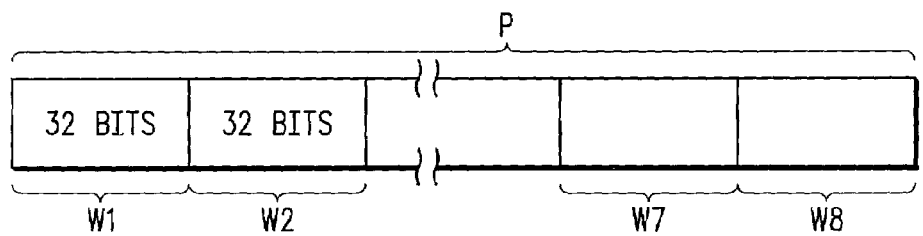
FIG. 4 is a diagram illustrating information in a page format suitable for use with the memory system of FIG. 2, 3, 5 or 6.

The memory system 301 of FIG. 3 is a page memory system. The memory cells 312 of the memory array 310 are designated P1 to P32. The memory cells 313 of the memory array 311 are designated P33 to P64. The "P" prefix of the designations indicates that each of the memory cells 312 and 313 is operable to store a page of information (or simply "page"), such as in the format illustrated in FIG. 4. Page P of FIG. 4 is made up of eight words W1, W2, . . . , W7 and W8. Each of the words W1, W2, . . . , W7 and W8 is made up of 32 bits. It will be appreciated depending on the intended use of the memory system 301, page P may contain more or less than eight words and each word may contain more or less than 32 bits.

Referring back to FIG. 3, the numerical suffixes "1" to "64" used in the designations of the memory cells 312 and 313 generally describe the order in which the processor 302 accesses the memory cells 312 and 313 during a read operation. In general, the decoding circuitry 320, 321 and 330 accesses a first page of a first row of the memory array 310 or 311 in response to an address signal having a first address, accesses a second page of a second row of the memory array 310 or 311 in response to the address signal having a second address consecutive to the first address and outputs the first and second pages. In particular, the processor 302 formats the address signals $A_0 \ldots A_M$ and $A_M \ldots (A_{M+N})$ to contain consecutive addresses associated with memory cells arranged along different rows of the memory arrays 310 and 311. The row decoder 330 upon receiving and decoding the address signals $A_0 \ldots A_M$ would activate row line RL1 to access memory cells P1, P3, P5, P7, P9, P11, P13 and P15; would activate row line RL2 to access memory cells P2, P4, P6, P8, P10, P12, P14 and P16; would activate row line RL3 to access memory cells P17, P19, P21, P23, P25, P27, P29 and P31; would activate row line RL4 to access memory cells P18, P20, P22, P24, P26, P28, P30 and P32; would activate row line RL5 to access memory cells P33, P35, P37, P39, P41, P43, P45 and P47; would activate row line RL6 to access memory cells P34, P36, P38, P40, P42, P44, P46 and P48; would activate row line RL7 to access memory cells P49, P51, P53, P55, P57, P59, P61 and P63; and would activate row line RL8 to access memory cells P50, P52, P54, P56, P58, P60, P62 and P64. The column decoders 320 and 321, upon receiving and decoding the address signals $A_M \ldots (A_{M+N})$, would operate in association with the row decoder 330 by activating respective column lines CL1 to CL8 accordingly. Pages from the accessed memory cells are output in the form of the data signal DATA [0:Z]. Therefore, in a common data read or write scenario in which pages must be cyclically and sequentially read from or written to only a small number of memory cells of the memory system 301, such as the memory cells designated P1, P2, P3, P4, P5, P6, P7 and P8, the embedded control system 300 would effectively distribute read disturb stress across two different rows of the memory array 310.

Figure 7:
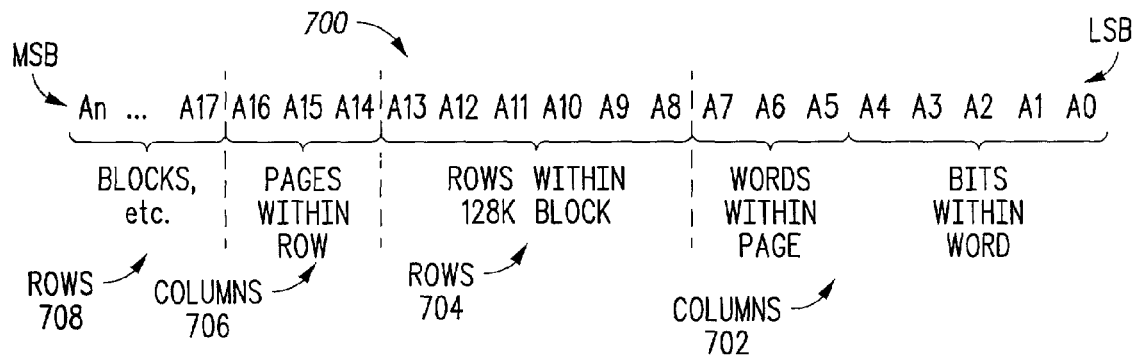
FIG. 7 is a diagram illustrating an addressing format suitable for use in the memory system of FIG. 2, 3, 5 or 6.
Figure 9:
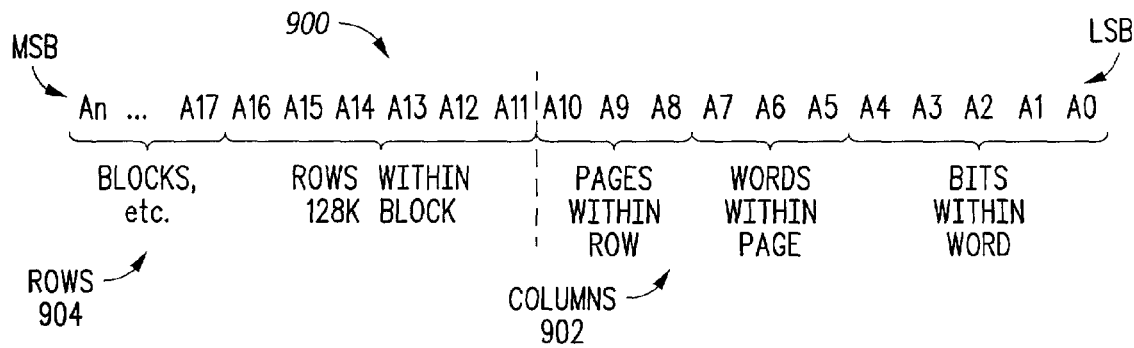
FIG. 9 is a diagram illustrating a prior art addressing format.

FIG. 7 illustrates an addressing format 700 used by the processors 302 to create the address signals $A_0 \ldots A_M$ and $A_M \ldots (A_{M+N})$ and, for purposes of clarity, is discussed in conjunction with a conventional addressing format 900 shown in FIG. 9. The conventional addressing format 900 of FIG. 9 shows address bits arranged from least significant bit LSB to most significant bit MSB, wherein less significant address bits A0 to A10 are used to address columns 902 of a memory array, and more significant bits A11 to An are used to address rows 904 of a memory array. The addressing format 700 of FIG. 7 shows numeric address bits arranged from least significant bit LSB to most significant bit MSB; however, unlike the conventional addressing format 900 of FIG. 9, the addressing format 700 of FIG. 7 uses some of the less significant bits A0 to A10 to address rows 704 and 708 of a memory array and some of the more significant bits A11 to An to address columns 702 and 706 of the memory array. Specifically, address bits A0 to A7 are used to address columns 702, address bits A14 to A16 are used to address columns 706, address bits A8 to A13 are used to address rows 704, and A17 to An are used to address rows 708. In addressing format 700, least significant bits A0 to A4 are representative of addresses of bits within a word, next least significant bits A5 to A7 are representative of addresses of words within a page, intermediate significant bits A8 to A13 are representative of addresses of rows, more significant bits A14 to A16 are representative of addresses of pages within rows and next more significant bits A17 to An are representative of addresses of memory blocks. By interposing row addressing between column addressing and using less significant bits to address rows, the addressing format 700 prevents large numbers of sequential pages from being accessible via a single row line.

FIG. 5 illustrates a second embedded control system 500 similar in structure to the embedded control system 300 of FIG. 3. The embedded control system 500 of FIG. 5 has a memory system 501 with a row decoder 530, column decoders 520 and 521, memory arrays 510 and 511, memory cells 512 and 513 (and memory blocks BLK1 and BLK2) arranged and interconnected in substantially the same manner as the counterpart structure in FIG. 3. The embedded control system 500 of FIG. 5 has a processor 502 and connections 542, 544 and 546 to carry row address signal $B_0 \ldots B_M$, column address signal $B_M \ldots (B_{M+N})$ and data signal DATA [0:Y], respectively, arranged and interconnected in substantially the same manner as the counterpart structure in FIG. 3. The memory system 501 is a page memory system with the memory cells 512 and 513 designated P1 to P32 and P33 to P64, respectively, and each of the memory cells 512 and 513 being operable to store a page.

The embedded control system 500 of FIG. 5 departs from the embedded control system 300 of FIG. 3 in the specific manner that the processor 502 formats the address signals $B_0 \ldots B_M$ and $B_M \ldots (B_{M+N})$ to contain consecutive addresses associated with memory cells arranged along different rows of the memory arrays 510 and 511. The row decoder 330 upon receiving and decoding the address signals $B_0 \ldots B_M$ would activate row line RL1 to access memory cells P1, P5, P9, P13, P17, P21, P25 and P29; would activate row line RL2 to access memory cells P2, P6, P10, P14, P18, P22, P26 and P30; would activate row line RL3 to access memory cells P3, P7, P11, P15, P19, P23, P27 and P31; would activate row line RL4 to access memory cells P4, P8, P12, P16, P20, P24, P28 and P32; would activate row line RL5 to access memory cells P33, P37, P41, P45, P49, P53, P57 and P61; would activate row line RL6 to access memory cells P34, P38, P42, P46, P50, P54, P58 and P62; would activate row line RL7 to access memory cells P35, P39, P43, P47, P51, P55, P59 and P63; and would activate row line RL8 to access memory cells P36, P40, P44, P48, P52, P56, P60 and P64. The column decoders 520 and 521, upon receiving and decoding the address signals $B_M \ldots (B_{M+N})$, would operate in association with the row decoder 530 by activating respective column lines CL1 to CL8 accordingly. Pages from the accessed memory cells are output in the form of the data signal DATA [0:Y]. Therefore, in a common data read or write scenario in which pages must be cyclically and sequentially read from or written to only a small number of memory cells of the memory system 501, such as memory cells designated P1, P2, P3, P4, P5, P6, P7 and P8, the embedded control system 500 would effectively distribute read disturb stress across four different rows of the memory array 510.

FIG. 6 illustrates a third embedded control system 600. The structure of the embedded control system 600, like the structure of the embedded control system 300 of FIG. 3, has a memory system 601 made up of two memory arrays 610 and 611 with memory cells 612 and 613, respectively, and two column decoders 620 and 621 coupled to respective ones of the memory arrays 610 and 611 by column lines CL1 to CL8. The structure of the embedded control system 600 of FIG. 6, like the structure of the embedded control system 300 of FIG. 3, has a processor 602 and connections 642, 644 and 646 to carry row address signal $C_0 \ldots C_M$, column address signal $C_M \ldots (C_{M+N})$ and data signal DATA [0:X], respectively. Unlike the embedded control system 300 of FIG. 3, the memory system 601 of the embedded control system 600 of FIG. 6 employs two distinct row decoders 630 and 631. The row decoder 630 is coupled to the processor 602 via connection 642 and to the memory array 610 via row lines RL1 to RL4. The row decoder 631 is coupled to the processor 602 via connection 642 and to the memory array 611 via row lines RL5 to RL8. In FIG. 6, a first memory block BLK1 is made up of the row decoder 630, the column decoder 620 and the memory array 610; and a second memory block BLK2 is made up of the row decoder 631, the column decoder 621 and the memory array 611. The memory system 601 is a page memory system with the memory cells 612 and 613 designated P1 to P32 and P33 to P64, respectively, and each of the memory cells 612 and 613 being operable to store a page.

To access the memory system 601 of the embedded control system 600 of FIG. 6, the processor 602 formats the address signals $C_0 \ldots C_M$ and $C_M \ldots (C_{M+N})$ to contain consecutive addresses associated with memory cells arranged along different rows of the memory arrays 610 and 611. The row decoder 630, upon receiving and decoding the address signals $C_0 \ldots C_M$, would activate row line RL1 to access memory cells P1, P9, P17, P25, P33, P41, P49 and P57; would activate row line RL2 to access memory cells P2, P10, P18, P26, P34, P42, P50 and P58; would activate row line RL3 to access memory cells P3, P11, P19, P27, P35, P43, P51 and P59; and would activate row line RL4 to access memory cells P4, P12, P20, P28, P36, P44, P52 and P60. The row decoder 631, upon receiving and decoding the address signals $C_0 \ldots C_M$, would activate row line RL5 to access memory cells P5, P13, P21, P29, P37, P45, P53 and P61; would activate row line RL6 to access memory cells P6, P14, P22, P30, P38, P46, P54 and P62; would activate row line RL7 to access memory cells P7, P15, P23, P31, P39, P47, P55 and P63; and would activate row line RL8 to access memory cells P8, P16, P24, P32, P40, P48, P56 and P64. The column decoders 620 and 621, upon receiving and decoding the address signal $C_M \ldots (C_{M+N})$, would operate in association with the row decoders 630 and 631, respectively, by activating the respective column lines CL1 to CL8 accordingly. Pages from the accessed memory cells are output in the form of the data signal DATA [0:X]. Therefore, in a common data read or write scenario in which pages must be cyclically and sequentially read from, or written to, only a small number of memory cells of the memory system 601, such as memory cells designated P1, P2, P3, P4, P5, P6, P7 and P8, the embedded control system 600 would effectively distribute read disturb stress across eight different rows of the memory arrays 610 and 611 (in combination) and across two memory blocks.

The addressable memory systems of FIGS. 2, 3, 5 and 6 may be burst mode memory systems that minimize read disturb by initiating, responsive to a first memory address, a first burst access to access a plurality of bits from a storage element of a first row of a memory array, and initiating, responsive to a second memory address consecutive to the first memory address, a second burst access to access a plurality of bits from a storage element of a second row of the memory array. In the burst mode memory system, a single memory address is used to access information from a series of sequential storage elements of a memory array. During a burst mode read operation, it takes two clock cycles to access a page, and one clock cycle to read each word within the page. Further accessing of another page requires two more clock cycles regardless of whether the second page is located on the same row or different row as the previous page. A row line is ramped up and down on each clock cycle. The ordering of the "PAGES WITHIN ROW" bits and the "ROWS WITHIN BLOCKS" bits of the addressing format 700 of FIG. 7 facilitate access of consecutively addressed pages on different rows of the memory array. While the burst mode memory system using the addressing format 700 of FIG. 7 and a conventional burst mode memory system using the conventional addressing format 900 of FIG. 9 both use the same amount of power and number of clock cycles to access pages, only the burst mode memory system using the addressing format 700 of FIG. 7 will effectively spread read disturb across multiple rows of the memory array.

Figure 8:
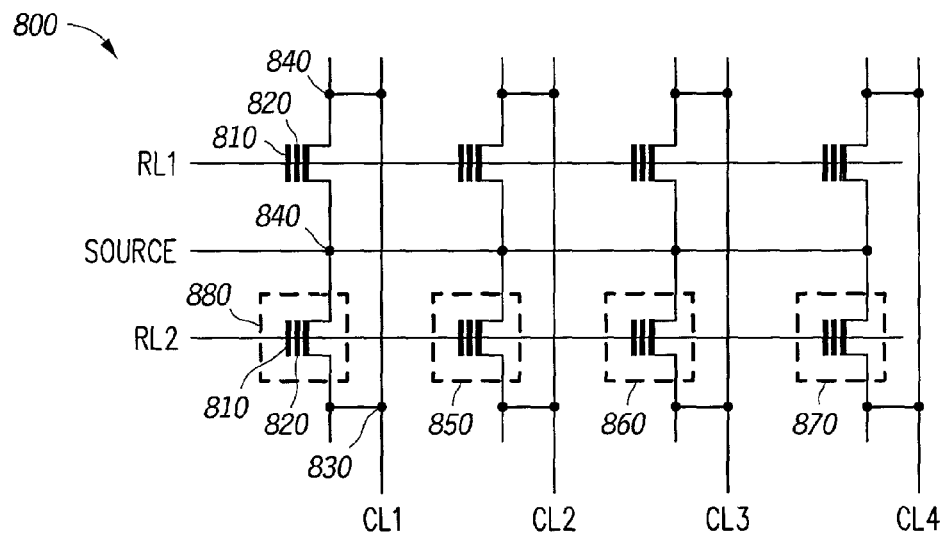
FIG. 8 is a schematic diagram illustrating a portion of a memory array suitable for use in the memory system of FIG. 2, 3, 5 or 6.

FIG. 8 illustrates, in schematic form, a portion of a memory array 800 for use in the memory systems 200, 301, 501 or 601 of FIG. 2, 3, 5 or 6, respectively. The memory array 800 is made up of floating gate-type memory cells arranged in a plurality of rows and columns through interconnection by row lines RL1 and RL2 and column lines CL1 to CL4. In particular, row line RL1 interconnects memory cells 850, 860, 870 and 880, each of which is representative of the memory cells of the memory array 800. Activation of particular combinations of row lines and column lines will access a memory cell for a read operation. The memory cell 880 comprises a control gate 810 that functions as the input of the memory cell, a floating gate 820, a source 840 and a drain 830 that functions as the output of the memory cell. The control gate 810 is connected to the row line RL2. The floating gate 820 stores charge indicative of the state of the memory cell. The drain 830 is connected to the column line CL1. The source 840 is connected to a common node via line SOURCE. In an embodiment where the memory cell 880 is a Flash EEPROM cell, the memory cell 880 is read by setting the row line RL1 to a voltage level of 2.5 V to 5 V, biasing the column line CL1 to a voltage level of 0.5 V to 1.5 V, and using a sense amplifier (not shown) to measure the current on the column line CL1 in order to determine whether the memory cell 880 is programmed or erased.

As an example of how read disturb affects a particular row of memory cells, consider the case where a read operation is to be performed on the memory cells 850, 860 and 870 in sequence. The row line RL2 is activated, and the column lines CL2, CL3 and CL4 are activated in sequence to read the information therefrom. Note that even though the memory cell 880 is not activated for reading, row line RL2 still holds a bias voltage on the control gate 810 of the memory cell 880 while reading information from the memory cells 850, 860 and 870. Thus, while no data is being read from the memory cell 880, reading data from the memory cells 850, 860 and 870 still contributes to a possible read disturb failure of the memory cell 880. In cases where a small program of instructions continuously accesses the same memory cells (e.g., the memory cells 850, 860 and 870) for a long period of time, the constant bias voltage maintained on the control gate of all memory cells connected to the same row line (e.g., row line RL2) can contribute to read disturb.

Many applications exist for the embodiments illustrated in FIGS. 2, 3, 5 and 6. Such embodiments may be readily employed in an embedded control system used in automotive applications. The processors 302, 502 and 602 may be microprocessors such as those used in wireless communication devices, and the memory arrays 310, 311, 510, 511, 610 and 611 may be used to store operating system instructions executable by the processor 302, 502 and 602. The memory systems 301, 501 and 601 may be formed on the same substrate and/or included in the same package as the processors 302, 502 and 602, respectively. It will be appreciated that other processor and/or memory types and configurations may be implemented according to the principles set forth herein.

While the above is specifically described with respect to minimization of read disturb caused by read operations, it will be recognized that the memory systems 200, 301, 501 and 602 may minimize gate disturb that can occur during write operations. For example, gate disturb may be minimized in the case where the memory systems 200, 301, 501 and 602 employ EEPROM and consecutive EEPROM cells are repeatedly rewritten.

In the foregoing, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

What is claimed is:

1. A memory system comprising:
    an array of addressable storage elements arranged in a plurality of rows and a plurality of columns, wherein the array of addressable storage elements comprises a plurality of nonvolatile memory cells; and
    decoding circuitry coupled to the array of addressable storage elements, the decoding circuitry, responsive to decoding a first element address, to access a first storage element of a first row of the plurality of rows, mid the decoding circuitry, responsive to decoding a second element address consecutive to the first element address, to access a second storage element of a second row of the plurality of rows, the second row of the plurality of rows different from the first row of the plurality of rows;
    wherein the first address comprises a group of bits;
    wherein the second address comprises a group of bits;
    wherein the decoding circuitry includes a row decoder and a column decoder;
    wherein the row decoder is operable responsive to a first portion of the group of bits of the first address and the second address;
    wherein the column decoder is operable responsive to a second portion of the group of bits of the first address and the second address, wherein a bit of the second portion is more significant than a bit of the first portion.

2. A memory system according to claim 1 wherein each of the storage elements stores one bit.

3. A memory system according to claim 1 wherein each of the storage elements stores a plurality of bits arranged as a word.

4. A memory system according to claim 1 wherein each of the storage elements stores a plurality of bits arranged as a page.

5. The memory system of claim 1 wherein each bit of the second portion is more significant than a least significant bit of the first portion.

6. A memory system according to claim 1 wherein each of the plurality of nonvolatile memory cells comprises a floating gate-type cell.

7. A memory system according to claim 1 wherein each of the plurality of nonvolatile memory cells comprises an EEPROM cell.

8. A memory system comprising:
an array of storage elements arranged in a plurality of rows and a plurality of columns, each of the storage elements comprising an input and an output, each of the storage elements corresponding to a numeric address comprising more significant bits and less significant bits, wherein the array of storage elements comprises a plurality of nonvolatile memory cells;
decoder circuitry operable responsive to a plurality of numeric addresses, including a first numeric address and a second numeric address, the second numeric address consecutive to the first numeric address, the decoder circuitry including:
   a column decoder coupled to the outputs of the storage elements of each of the plurality of columns, the column decoder operable responsive to at least one of the more significant bits, the column decoder operable responsive to a portion of the first numeric address and a portion of the second numeric address; and
   a row decoder coupled to the inputs of the storage elements of each of the plurality of rows, the row decoder operable responsive to at least one of the less significant bits, the row decoder operable responsive to a portion of the first numeric address and a portion of the second numeric address.

9. A memory system according to claim 8 wherein the input of each of the storage elements is a control gate, and the output of each of the storage elements is a drain.

10. A memory system according to claim 8 wherein each of the storage elements stores one bit.

11. A memory system according to claim 8 wherein each of the storage elements stores a plurality of bits arranged as a word.

12. A memory system according to claim 8 wherein each of the storage elements stores a plurality of bits arranged as a page.

13. A memory system according to claim 8 wherein each of the plurality of nonvolatile memory cells comprises a floating gate-type cell.

14. A memory system according to claim 8 wherein the at least one of the less significant bits comprises all of the less significant bits.

15. The memory system of claim 8 wherein:
the numeric address comprises a group of bits;
the row decoder is operable responsive to a first portion of the group of bits;
the column decoder is operable responsive to a second portion of the group of bits, wherein each bit of the second portion is more significant than a least significant bit of the first portion.

16. A memory system according to claim 8 wherein each of the plurality of nonvolatile memory cells comprises an EEPROM cell.

17. An embedded control system comprising:
a processor; and
a memory system coupled to the processor, the memory system comprising an input to receive an address signal from the processor, an output to send addressed information to the processor, and a plurality of blocks, each of the plurality of blocks comprising:
an array of nonvolatile memory cells arranged in a plurality of rows and a plurality of columns to store information within a plurality of pages, each of the plurality of pages comprising a plurality of words, each of the plurality of words comprising a plurality of bits; and
decoding circuitry comprising a cohumn decoder and a row decoder, the decoding circuitry coupled to the input, the output and the array of nonvolatile memory cells, the decoding circuitry, responsive to the address signal having a first page address, accessing a first page of a first row of the plurality of rows, the decoding circuitry, responsive to the address signal having a second page address consecutive to the first page address, accessing a second page of a second row of the plurality of rows, and, thereafter, the decoding circuitry coupling the first and second pages to the output;
wherein each address comprises a group of bits;
wherein the row decoder is operable responsive to a first portion of the group of bits;
wherein the column decoder is operable responsive to a second portion of the group of bits, wherein a bit of the second portion is more significant than a bit of the first portion.

18. The embedded control system of claim 17, wherein at least one bit of the group of bits is representative of addresses of the plurality of blocks.

19. An embedded control system according to claim 17 wherein each memory cell of the array of nonvolatile memory cells comprises a floating gate-type cell.

20. An embedded control system according to claim 17 wherein each memory cell of the array of nonvolatile memory cells comprises an EEPROM cell.

21. An embedded control system comprising:
a processor; and
a memory system coupled to the processor, the memory system comprising an input to receive an address signal from the processor, an output to send addressed information to the processor, and a plurality of blocks, each of the plurality of blocks comprising:
an array of nonvolatile memory cells arranged in a plurality of rows and a plurality of columns to store information within a plurality of pages, each of the plurality of pages comprising a plurality of words, each of the plurality of words comprising a plurality of bits; and
decoding circuitry comprising a column decoder and a row decoder, the decoding circuitry coupled to the input, the output and the array of nonvolatile memory cells, the decoding circuitry, responsive to the address signal having a first page address, accessing a first page of a first row of the plurality of rows, the decoding circuitry, responsive to the address signal having a second page address consecutive to the first page address, accessing a second page of a second row of the plurality of rows, and, thereafter, the decoding circuitry coupling the first and second pages to the output;
wherein the address signal comprises:
   least significant bits representative of addresses of bits within a word,
   next least significant bits representative of addresses of words within a page,
   intermediate significant bits representative of addresses of the plurality of rows, the intermediate significant bits more significant than the next least significant bits,
   more significant bits representative of addresses of pages within the plurality of rows, the more significant bits more significant than tbe intermediate significant bits, and next more significant bits representative of addresses of the plurality of blocks, the next more significant bits more significant than the more significant bits.

22. A method of accessing a memory system, the memory system comprising an array of addressable storage elements arranged in a plurality of rows and a plurality of columns, wherein the array of addressable storage elements comprises a plurality of nonvolatile memory cells, the method comprising:
decoding a first element address;
accessing, responsive to the first element address, a first storage element of a first row of the plurality of rows;
decoding a second element address, the second element address consecutive to the first element address; and
accessing, responsive to the second element address, a second storage element of a second row of the plurality of rows, the second row of the plurality of rows different from the first row of the plurality of rows;
wherein the first element address includes a group of bits;
wherein the decoding the first element address further includes decoding a first portion of the group of bits by a row decoder and decoding a second portion of the group of bits by a column decoder;
wherein a bit of the second portion is more significant than a bit of the first portion.

23. A method according to claim 22 wherein accessing a first storage element comprises reading a first page, the first page comprising a plurality of bits.

24. A method according to claim 23 wherein accessing a second storage element comprises reading a second page different from the first page, the second page comprising a plurality of bits.

25. A method according to claim 22 wherein accessing a first storage element comprises initiating a first burst access, the first burst access comprising a plurality of bits.

26. A method according to claim 25 wherein accessing a second storage element comprises initiating a second burst access different from the first burst access, the second burst access comprising a plurality of bits.

27. The method of claim 22 wherein each bit of the second portion is more significant than a least significant bit of the first portion.

28. A method according to claim 22 wherein each of the plurality of nonvolatile memory cells comprises a floating gate-type cell.

29. A method according to claim 22 wherein each of the plurality of nonvolatile memory coils comprises an EEPROM cell.

30. An embedded control system comprising:
a processor; and
a memory system coupled to the processor, the memory system comprising an input to receive an address signal from the processor, an output to send addressed information to the processor, and a plurality of blocks, each of the plurality of blocks comprising:
an array of nonvolatile memory cells arranged in a plurality of rows and a plurality of columns to store infonnation within a plurality of pages, each of the plurality of pages comprising a plurality of words, each of the plurality of words comprising a plurality of bits; and
decoding circuitry comprising a column decoder and a row decoder, the decoding circuitry coupled to the input, the output and the array of nonvolatile memory cells, the decoding circuitry, responsive to the address signal having a first page address, accessing a first page of a first row of the plurality of rows, the decoding circuitry, responsive to the address signal having a second page address consecutive to the first page address, accessing a second page of a second row of the plurality of rows, and, thereafter, the decoding circuitry coupling the first and second pages to the output;
wherein:
the address signal comprises a group of bits;
the row decoder is operable responsive to a first portion of the group of bits;
the column decoder is operable responsive to a second portion of the group of bits, wherein each bit of the second portion is more significant than a least significant bit of the first portion.

31. An embedded control system according to claim 30 wherein each memory cell of the array of nonvolatile memory cells comprises a floating gate-type cell.

32. An embedded control system according to claim 30 wherein each memory cell of the array of nonvolatile memory cells comprises an EEPROM cell.

33. A memory system comprising an input to receive an address signal, an output to send addressed information, and a plurality of blocks, each of the plurality of blocks comprising:
an array of nonvolatile memory cells arranged in a plurality of rows and a plurality of columns to store information within a plurality of pages, each of the plurality of pages comprising a plurality of words, each of the plurality of words comprising a plurality of bits; and
decoding circuitry comprising a column decoder and a row decoder, the decoding circuitry coupled to the input, the output and the array of nonvolatile memory cells, the decoding circuitry, responsive to the address signal having a first page address, accessing a first page of a first row of the plurality of rows, the decoding circuitry, responsive to the address signal having a second page address consecutive to the first page address, accessing a second page of a second row of the plurality of rows, and, thereafter, the decoding circuitry coupling the first and second pages to the output;
wherein the address signal comprises:
a first group of bits representative of addresses of the plurality of rows,
a second group of bits representative of addresses of pages within the plurality of rows, wherein the second group includes a bit more significant than a bit of the first group;
a third group of at least one bit representative of addresses of the plurality of blocks.

34. A memory system according to claim 33 wherein each memory cell of the away of nonvolatile memory cells comprises a floating gate-type cell.

35. A memory system according to claim 33 wherein each memory cell of the array of nonvolatile memory cells comprises an EEPROM cell.

* * * * *

UNITED STATES PATENT AND TRADEMARK OFFICE
CERTIFICATE OF CORRECTION

PATENT NO. : 7,269,090 B2 Page 1 of 1
APPLICATION NO. : 09/772830
DATED : January 30, 2001
INVENTOR(S) : Frank Kelsey Baker, Jr.

It is certified that error appears in the above-identified patent and that said Letters Patent is hereby corrected as shown below:

Column 8, Line 33, Claim No. 1:
    Change "mid" to --and--

Column 9, Line 19, Claim No. 8:
    Change "nortion" to --portion--

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,269,090 B2  Page 1 of 1
APPLICATION NO. : 09/772830
DATED : September 11, 2007
INVENTOR(S) : Frank Kelsey Baker, Jr.

It is certified that error appears in the above-identified patent and that said Letters Patent is hereby corrected as shown below:

Column 8, Line 33, Claim No. 1:
    Change "mid" to --and--

Column 9, Line 19, Claim No. 8:
    Change "nortion" to --portion--

This certificate supersedes the Certificate of Correction issued May 20, 2008.

Signed and Sealed this

Seventeenth Day of June, 2008

JON W. DUDAS
*Director of the United States Patent and Trademark Office*